(12) United States Patent
Langer et al.

(10) Patent No.: US 10,051,578 B2
(45) Date of Patent: *Aug. 14, 2018

(54) APPARATUS AND METHOD FOR DETERMINING INFORMATION ON A POWER VARIATION OF A TRANSMIT SIGNAL

(71) Applicant: Intel IP Corporation, Santa Clara, CA (US)

(72) Inventors: Andreas Langer, Lohhof (DE); Thomas Bruder, Grafing (FI)

(73) Assignee: Intel IP Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/415,654

(22) Filed: Jan. 25, 2017

(65) Prior Publication Data

US 2017/0295547 A1 Oct. 12, 2017

Related U.S. Application Data

(63) Continuation of application No. 14/341,115, filed on Jul. 25, 2014, now Pat. No. 9,588,158.

(30) Foreign Application Priority Data

Jul. 30, 2013 (DE) .................. 10 2013 108 128

(51) Int. Cl.
*H04B 17/00* (2015.01)
*H04W 52/22* (2009.01)
(Continued)

(52) U.S. Cl.
CPC ........ *H04W 52/226* (2013.01); *G01R 21/133* (2013.01); *H04B 1/0458* (2013.01)

(58) Field of Classification Search
CPC ... H04W 52/226; H04W 52/04; H04B 1/0458
See application file for complete search history.

(56) References Cited

U.S. PATENT DOCUMENTS 5,564,086 A 10/1996 Cygan et al.
6,842,011 B1 1/2005 Page et al.
(Continued)

FOREIGN PATENT DOCUMENTS

DE 2710752 A1 9/1978
DE 102006001687 A1 10/2006
(Continued)

OTHER PUBLICATIONS

U.S. Appl. No. 14/341,115, filed Jul. 25, 2014, Apparatus and Method for Determining Information on a Power Variation of a Transmit Signal.

(Continued)

*Primary Examiner* — Tuan Pham
(74) *Attorney, Agent, or Firm* — Schwegman Lundberg & Woessner, P.A.

(57) ABSTRACT

An apparatus for determining information on a power variation of a transmit signal comprises a power amplifier module, an antenna module and a power variation determining module. The power amplifier module amplifies a radio frequency transmit signal and the antenna module transmits at least partly the amplified radio frequency transmit signal. The power variation determining module determines a weighted sum of a first feedback signal derived from the amplified radio frequency transmit signal and a second feedback signal derived from the amplified radio frequency transmit signal. The first feedback signal and the second feedback signal comprise different dependencies on a varying impedance at the antenna module. Further, the power variation determining module generates a power variation signal based on the weighted sum. The power variation (Continued)

signal comprises information related to a power variation of the amplified radio frequency transmit signal.

24 Claims, 4 Drawing Sheets

(51) Int. Cl.
    *G01R 21/133*     (2006.01)
    *H04B 1/04*     (2006.01)

(56) References Cited

U.S. PATENT DOCUMENTS

| | | | |
|---|---|---|---|
| 8,774,743 | B2 | 7/2014 | Ali et al. |
| 9,588,158 | B2* | 3/2017 | Langer ............... H04W 52/226 |
| 2011/0148519 | A1 | 6/2011 | Drogi et al. |
| 2011/0175681 | A1 | 7/2011 | Inamori et al. |
| 2012/0275330 | A1* | 11/2012 | Sipila .................. H04W 52/42 370/252 |
| 2014/0218106 | A1* | 8/2014 | Drogi ..................... H03F 3/24 330/129 |
| 2014/0361953 | A1* | 12/2014 | Spokoinyi ............. H01P 5/184 343/905 |
| 2015/0035545 | A1 | 2/2015 | Langer et al. |

FOREIGN PATENT DOCUMENTS

| | | |
|---|---|---|
| DE | 102008026524 A1 | 12/2008 |
| EP | 1719250 B1 | 7/2010 |

OTHER PUBLICATIONS

"U.S. Appl. No. 14/341,115, Examiner Interview Summary dated Apr. 27, 2016", 3 pgs.

"U.S. Appl. No. 14/341,115, Final Office Action dated Jun. 6, 2016", 15 pgs.

"U.S. Appl. No. 14/341,115, Non Final Office Action dated Jan. 21, 2016", 12 pgs.

"U.S. Appl. No. 14/341,115, Notice of Allowance dated Oct. 24, 2016", 9 pgs.

"U.S. Appl. No. 14/341,115, Response filed Apr. 21, 2016 to Non Final Office Action dated Jan. 21, 2016", 14 pgs.

"U.S. Appl. No. 14/341,115, Response filed Oct. 6, 2016 to Final Office Action dated Jun. 6, 2016", 10 pgs.

"LTC1758-1—RF Power Controllers with 250kHz Control Loop Bandwidth and 40dB Dynamic Range", Linear Technology, [online]. Retrieved from the Internet: <URL: http://www.linear.com/product/LTC1758-1>, (Accessed on Jun. 30, 2014), 2 pgs.

"Stable, Closed-Loop Automatic Power Control for RF Applications", Analog Devices. Circuit Note CN-0050., (2008), 3 pgs.

"German Application Serial No. 102013108 128.2, Office Action dated Sep. 15, 2017", W/ English Translation, 11 pgs.

* cited by examiner

APPARATUS AND METHOD FOR DETERMINING INFORMATION ON A POWER VARIATION OF A TRANSMIT SIGNAL

PRIORITY APPLICATION

This application is a continuation of U.S. patent application Ser. No. 14/341,115, filed Jul. 25, 2014, which claims the benefit of priority to German Application No. 102013108128.2, filed Jul. 30, 2013, each of which is incorporated herein by reference in its entirety.

TECHNICAL FIELD

The present disclosure relates to the determination of properties of electrical signals and in particular to an apparatus and a method for determining information on a power variation of a transmit signal.

BACKGROUND

The power amplification of electrical signals is an often necessary task, especially if signals are transmitted over long distances (e.g. wireless). For example, the power amplifier (PA) in a mobile terminal has to cope with a wide range of load impedances, since the antenna impedance is heavily affected by instantaneous environmental conditions (e.g. free space, antenna covered by hand). Many power amplifiers are optimized for 50Ω conditions and also power amplifier specification may not care about mismatch (e.g. despite requirements for ruggedness and stability). For instance, the power variation into a non-50Ω antenna load may be neglected, which increases the effort for antenna and radio frequency (RF) engine design (e.g. to optimize post power amplifier matching and antenna matching).

Since the radiated power is often not satisfying, the network operators started to define specific requirements (so-called total radiated power requirements, TRP), especially in area where the coverage is minimal. One related requirement may be the power variation into voltage standing wave ratio (VSWR, output power ripple caused by non-50Ω antenna impedance). It is desired to minimize the power variation into mismatch.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
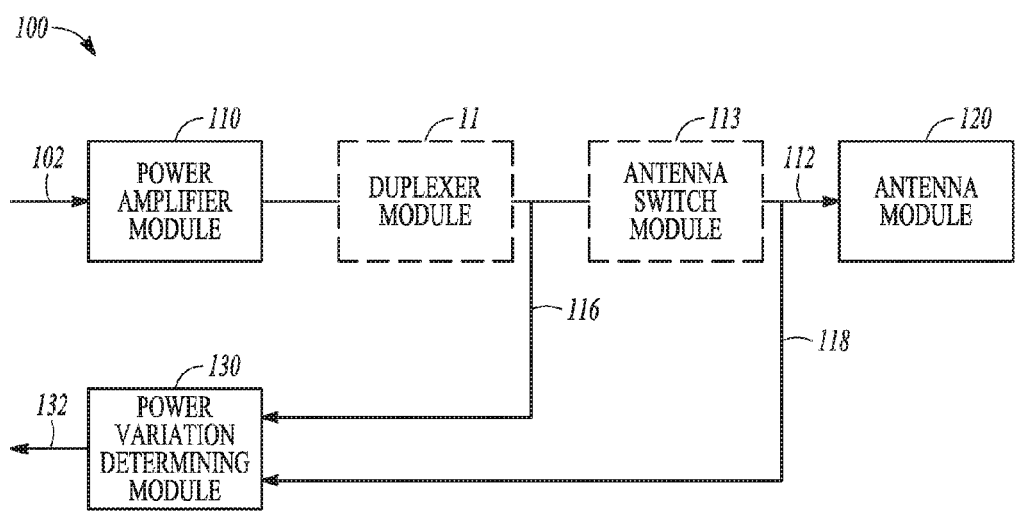
FIG. 1 shows a block diagram of an apparatus for determining information on the power variation of a transmit signal.

FIG. 1 shows a block diagram of an apparatus 100 for determining information on a power variation of a transmit signal. The apparatus 100 comprises a power amplifier module 110, an antenna module 120 and a power variation determining module 130. The power amplifier module 110 amplifies a radio frequency transmit signal 102 and the antenna module 120 transmits at least partly the amplified radio frequency transmit signal 112. The power variation determining module 130 determines a weighted sum of a first feedback signal 116 derived from the amplified radio frequency transmit signal 112 and a second feedback signal 118 derived from the amplified radio frequency transmit signal 112. The first feedback signal 116 and the second feedback signal 118 comprise different dependencies on a varying impedance at the antenna module 120. Further, the power variation determining module 130 generates a power variation signal 132 based on the weighted sum so that the power variation signal 132 comprises information related to a power variation of the amplified radio frequency transmit signal 112.

By calculating a weighted sum of two signals derived from a radio frequency transmit signal 112 but with different dependencies on an impedance at the antenna module 120, an influence of variations of the impedance at the antenna module 120 or the weighted sum (e.g. which may vary due to varying environmental conditions) can be kept low or even completely removed. In this way, an information on the power variation of the amplified radio frequency transmit signal 112 can be determined without a contribution of the varying impedance at the antenna module 120 or with negligible contribution of the varying impedance at the antenna module 120. In other words, due to the consideration of the weighted sum, information on a power variation for a nearly perfectly or a perfectly matched antenna module can be provided. Such information may be used for the control of the gain of the power amplifier module 110 without or with negligible influence of the variation of the impedance at the antenna module 120. In this way, the power variation into mismatch may be significantly reduced, for example.

The radio frequency transmit signal 102 may be provided by an arbitrary source. For example, the radio frequency transmit signal 102 may be provided by a modulator module (e.g. in-phase/quadrature-phase modulator or polar modulator) generating the radio frequency transmit signal 102 by an up-conversion from a baseband domain (e.g. frequencies below 100 MHz) to a radio frequency domain (e.g. frequencies between 500 MHz and 10 GHz). The up-conversion may be done at least by mixing a complex-valued baseband transmit signal with a carrier signal (e.g. a local oscillator signal). The resulting radio frequency transmit signal 102 may comprise a frequency bandwidth located in the region of the frequency of the carrier signal.

The radio frequency transmit signal 102 may be a test signal for determining information on the power variation of the amplified radio frequency transmit signal 112 or may contain information intended to be transmitted to a receiver, for example. In this way, information on a power variation of the amplified radio frequency transmit signal 112 can be determined in a test state and/or in an operating state (e.g. while transmitting information to be received by a receiver) of the apparatus 100.

The power amplifier module 110 amplifies the radio frequency transmit signal 102. For this, the power amplifier module 102 may comprise at least a power amplifier circuit. Optionally, the power amplifier module 110 may comprise further elements for providing the amplified radio frequency transmit signal 112 with high quality (e.g. power amplifier core, controller, matching module, bias feed and/or one or more filter elements).

The power amplifier module 110 may amplify the radio frequency transmit signal 102 so that the amplified radio frequency transmit signal 112 can be transmitted to a receiver through the antenna module 120 with sufficient transmit power.

The antenna module 120 transmits at least partly the amplified radio frequency transmit signal 112. Depending on the matching of the antenna module 120 and/or the environmental conditions in the proximity of the antenna module 120 and/or the way the feedback signals are derived from the amplified radio frequency transmit signal 112, the whole amplified radio frequency transmit signal 112 is transmitted or a part of the amplified radio frequency transmit signal 112 is reflected due to mismatch or is used for deriving the first feedback signal 116 and/or the second feedback signal 118, for example. The antenna module 120 may comprise one or more antennas (e.g. one antenna for single-input-single-output communication, multiple antennas for multiple-input-multiple-output communication).

The first feedback signal 116 and the second feedback signal 118 are derived from the amplified radio frequency transmit signal 112. A signal may be derived from the amplified radio frequency transmit signal 112 in various ways. For example, a coupling element may be located in the proximity of a transmit path between the power amplifier module 110 and the antenna module 120 so that the coupling element provides a single correlated to the amplified radio frequency transmit signal 112 due to capacitive and/or inductive coupling. For example, a coupling element may be a capacitor or a directional coupler.

Such a coupling element may provide the first feedback signal 116 and/or the second feedback signal 118 itself or may provide a signal to be processed in order to obtain the first feedback signal 116 and/or the second feedback signal 118. In both cases, the first feedback signal 116 and the second feedback signal 118 is derived from the amplified radio frequency transmit signal 112. In other words, the first feedback signal 116 and the second feedback signal 118 may comprise signal portions related to the amplified radio frequency transmit signal and a reverse wave signal caused by a reflection of the amplified radio frequency transmit signal 112 due to a varying impedance mismatch at the antenna module 120.

Both feedback signals are derived from the amplified radio frequency transmit signal 112 so that both signals comprise a dependency on a varying impedance at the antenna module 120. However, the first feedback signal 116 comprises a dependency on the varying impedance at the antenna module 112 (e.g. a larger or lower portion related to a signal reflected due to mismatch) different from a dependency on the varying impedance at the antenna module 120 of the second feedback signal 118. For example, feedback signals with different dependencies on the varying impedance at the antenna module 120 may be obtained by deriving the first feedback signal 116 and the second feedback signal 118 at different positions within the transmit path between the power amplifier module 110 and the antenna module 120 or obtained the signals at different ports of a directional coupler within the transmit path between the power amplifier 110 and the antenna module 120.

The impedance at the antenna module 120 may be an impedance observed or perceived at a connection or terminal (e.g. pin) of the antenna module 120 connecting the antenna module 120 to the transmit path. This varying impedance at the antenna module 120 may be representable by an impedance of the antenna module 120 (e.g. frequency-dependent but constant in time for constant frequency) and a temporarily varying impedance due to varying environmental conditions in the proximity of the antenna module 120 (e.g. free space or antenna covered by a moving object).

The power variation determining module 130 determines the weighted sum of the first feedback signal 116 and the second feedback signal 118. The weighted sum may represent a sum of the first feedback signal 116 weighted by a weighting factor and the second feedback signal 118 or a sum of the first feedback signal 116 and the second feedback signal 118 weighted by a weighting factor. The weighted sum may be calculated or determined continuously (e.g. if the first feedback signal and the second feedback signal are analog signals) or may be determined or calculated over a predefined number of samples of the first feedback signal 116 and the second feedback signal 118 (e.g. if the first feedback signal and the second feedback signal are digital signals).

In the following, the second feedback signal 118 may be weighted by a weighting factor, although a weighting of the first feedback signal 116 or a weighting of both feedback signals (e.g. by different weighting factors) may also be possible.

Additionally, the power variation determining module 130 generates the power variation signal 132 comprising information related to a power variation of the amplified radio frequency transmit signal 112. Information related to the power variation of the amplified radio frequency transmit signal 112 may be represented in various ways. For example, the information may indicate a change of an average output power of the power amplifier module 110 over time (e.g. arithmetic mean or root mean square) or an average output power of the power amplifier module 110 (e.g. arithmetic mean or root mean square) or a current output power of the power amplifier module 110 or a maximal, minimal or average variation of the output power of the power amplifier module 110 over a predefined time interval. For example, the power variation determining module 130 may generate the power variation signal 132 based on a root mean square calculation of the weighted sum over a predefined time interval (e.g. for a predefined number of temporarily successively-calculated weighted sums). In other words, the power variation signal may contain information on the root mean square of the determined weighted sum. In this way, information related to a power variation of the amplified radio frequency transmit signal 112 over time can be provided with low effort and/or in real time.

The power variation determining module 130 may determine the weighted sum in various ways. As already mentioned, the first feedback signal 116 or the second feedback signal 118 may be weighted by a weighting factor. For example, the weighted sum may be determined or calculated by adding the first feedback signal 116 and the second feedback signal 118 weighted by a weighting factor $c_{weight}$. This may be equal to an addition of the first feedback signal weighted by the inverse weighting factor $1/c_{weight}$ and the second feedback signal 118 or a subtraction of the second feedback signal weighted by the negative weighting factor $-c_{weight}$ from the first feedback signal 116. In other words, the weighting factor $c_{weight}$ can be selected so that the weighted sum may be calculated or determined by adding the first feedback signal 116 and the second feedback signal 118 weighted by a weighting factor $c_{weight}$, adding the first feedback signal 116 weighted by a weighting factor $c_{weight}$ and the second feedback signal 118, subtracting the first feedback signal 116 weighted by a weighting factor $c_{weight}$ from the second feedback signal 118 or subtracting the second feedback signal 118 weighted by a weighting factor $c_{weight}$ from the first feedback signal 116, for example.

The weighting factor may be selected in various ways (e.g. depending on the type of feedback signal or depending on the way the feedback signals are derived from the amplified radio frequency transmit signal). For example, the weighting factor may be a complex value for complex-valued feedback signals. For example, the first feedback signal 116 and the second feedback signal 118 may be complex-valued electrical signals in an in-phase/quadrature-phase representation (comprising an in-phase signal and a quadrature-phase signal) or a polar representation (comprising an amplitude signal and a phase signal).

The first feedback signal 116 or the second feedback signal 118 may be weighted with the weighting factor by multiplying or dividing the first feedback signal 116 or the second feedback signal 118 by the weighting factor, for example.

As already mentioned, the amplified radio frequency transmit signal 112 may comprise a frequency bandwidth in the range of a center frequency (e.g. frequency of local oscillator signal for up-conversion of the transmit signal to the radio frequency domain). In other words, the center frequency may be located within the frequency bandwidth of the amplified radio frequency transmit signal 112. In this case, the weighting factor may be constant for a given or constant center frequency of the amplified radio frequency transmit signal 112. For example, the apparatus 100 may only process radio frequency transmit signals 102 with the same center frequency or with negligible variation (e.g. less than bandwidth of amplified radio frequency transmit signal) of the center frequency. In this case, the weighting factor may be kept constant so that the determination of the weighted sum can be implemented with low effort.

Alternatively, the apparatus 100 may process or transmit radio frequency transmit signals 102 with various different center frequencies (e.g. within two or more different mobile communication frequency bands) over time. For example, an up-conversion of a baseband transmit signal may be done with various local oscillator signals comprising various frequencies so that the center frequency of the radio frequency transmit signal 102 varies over time. In this example, the weighting factor may vary for different center frequencies. In other words, the weighting factor may comprise a first value for a first center frequency of an amplified radio frequency transmit signal 112 and may comprise a second value for a second center frequency (different from the first center frequency) of an amplified radio frequency transmit signal 112. In this way, a significant reduction of the influence of an antenna impedance mismatch on the information related to a power variation of the amplified radio frequency transmit signal 112 determined by the power variation determining module 130 can be obtained for a large frequency range.

The weighting factor can be selected so that the weighted sum is independent of the varying impedance at the antenna module 120 or causes only a negligible contribution to the weighted sum. In other words, the weighting factor may be selected (e.g. calculated or selected from a lookup table) or predefined (e.g. stored by a memory module) so that the portion of the weighted sum depending on a varying impedance at the antenna module is less than 1% (or less than 10%, less than 0.1% or less than 0.01%) of the weighted sum or of the power variation indicated by the power variation signal 132 or the weighted sum (or the power variation indicated by the power variation signal) is independent of a varying impedance of the antenna module 120. In this way, an accurate information on the power variation of the power amplifier module 110 without or with negligible influence of an impedance mismatch at the antenna module 120 can be provided.

In other words, the weighting factor may be selected or predefined so that a portion of the weighted sum depending on a reverse wave signal reflected due to a varying impedance mismatch at the antenna module 120 is less than 1% (or less than 10%, less than 0.1% or less than 0.01%) of the weighted sum or the weighted sum is independent of the reverse wave signal reflected due to a varying impedance mismatch at the antenna module 120.

An example for a possible calculation of a predefined weighting factor or a weighting factor to be selected is described in connection with FIG. 2 below.

The weighting factor may be calculated by the power variation determining module 130 (e.g. depending on center frequency or a frequency band of the amplified radio frequency transmit signal) or may be stored by a memory module and provided for the determination of the weighted sum. In other words, the power variation determining module 130 may comprise a memory module for providing the weighting factor (e.g. a single register or memory address, if the weighting factor is constant in any case). Alternatively, a plurality of weighting factors (e.g. for different center frequencies or frequency bandwidths of the amplified radio frequency transmit signal) may be stored by the memory module. In other words, the power variation determining module 130 may comprise a memory module comprising a stored lookup table (LUT) configured to provide the weighting factor (e.g. frequency depending). In this way, a constant weighting factor or a plurality of weighting factors enabling a frequency-dependent selection of a suitable weighting factor can be provided with low effort.

The apparatus 100 may comprise one or more additional optional elements within the transmit path between the power amplifier module 110 and the antenna module 120. For example, the apparatus 100 may comprise a duplexer module (e.g. if the apparatus is used by a transceiver) configured to provide the amplified radio frequency transmit signal 112 to the antenna module 120 and to provide signals received by the antenna module 120 to a receive path or a receiver module.

Optionally, additionally or alternatively, the apparatus 100 may comprise an antenna switch module within the transmit path between the power amplifier module 110 and the antenna module 120. The antenna switch module may switch the amplified radio frequency transmit signal 112 to an antenna of the antenna module 120. The antenna module 120 may comprise a plurality of antennas and the antenna switch module may switch the amplified radio frequency transmit signal 112 to one or more antennas of the plurality of antennas of the antenna module 120, for example.

Optionally, additionally or alternatively to one or more aspects mentioned above, the first feedback signal 116 may be derived from the amplified radio frequency transmit signal 112 at a position within the transmit path between the power amplifier module 110 and the duplexer module and the second feedback signal 118 may be derived from the amplified radio frequency transmit signal 112 at a position within the transmit path between the duplexer module and the antenna module 120. Alternatively, the first feedback signal 116 may be derived from the amplified radio frequency transmit signal 112 between the duplexer module and the antenna switch module and the second feedback signal 118 may be derived from the amplified radio frequency transmit signal between the antenna switch module and the antenna module 120. In these cases, the first feedback signal 116 and the second feedback signal 118 may be derived by a coupling element capacitively or inductively coupled to the transmit path (e.g. capacitor).

Alternatively, the first feedback signal 116 and the second feedback signal 118 may be derived from the amplified radio frequency transmit signal 112 by a directional coupler located within the transmit path between the power amplifier module 110 and the duplexer module, between the duplexer module and the antenna switch module or between the antenna switch module and the antenna module 120.

Each of these examples provide two feedback signals with different dependencies on the varying impedance at the antenna module 120.

The power variation determining module 130 may provide the power variation signal 132 in order to trigger a warning, if the power variation of the amplified radio frequency transmit signal 112 exceeds a predefined threshold. Alternatively, the power variation determining module may control a gain of the power amplifier module 110 based on the power variation signal 132. In this way, a feedback loop can be implemented so that the power variation of the amplified radio frequency transmit signal 112 can be kept low.

For this, the power variation signal 132 may be generated in real time (e.g. within a loop time of less than 1 ms) so that the gain control of the power amplifier module 110 based on the power variation signal 132 may be enabled.

The power amplifier module 110, the antenna module 120 and/or the power variation determining module 130 may be independent hardware units or part of a processor, a microcontroller or a digital signal processor or a computer program or a software product for running on a processor, a microcontroller or a digital signal processor. Further, these modules may be manufactured independently of each other or at least partly together (e.g. on the same semiconductor die or sharing at least some same parts of an electric circuit).

Figure 2:
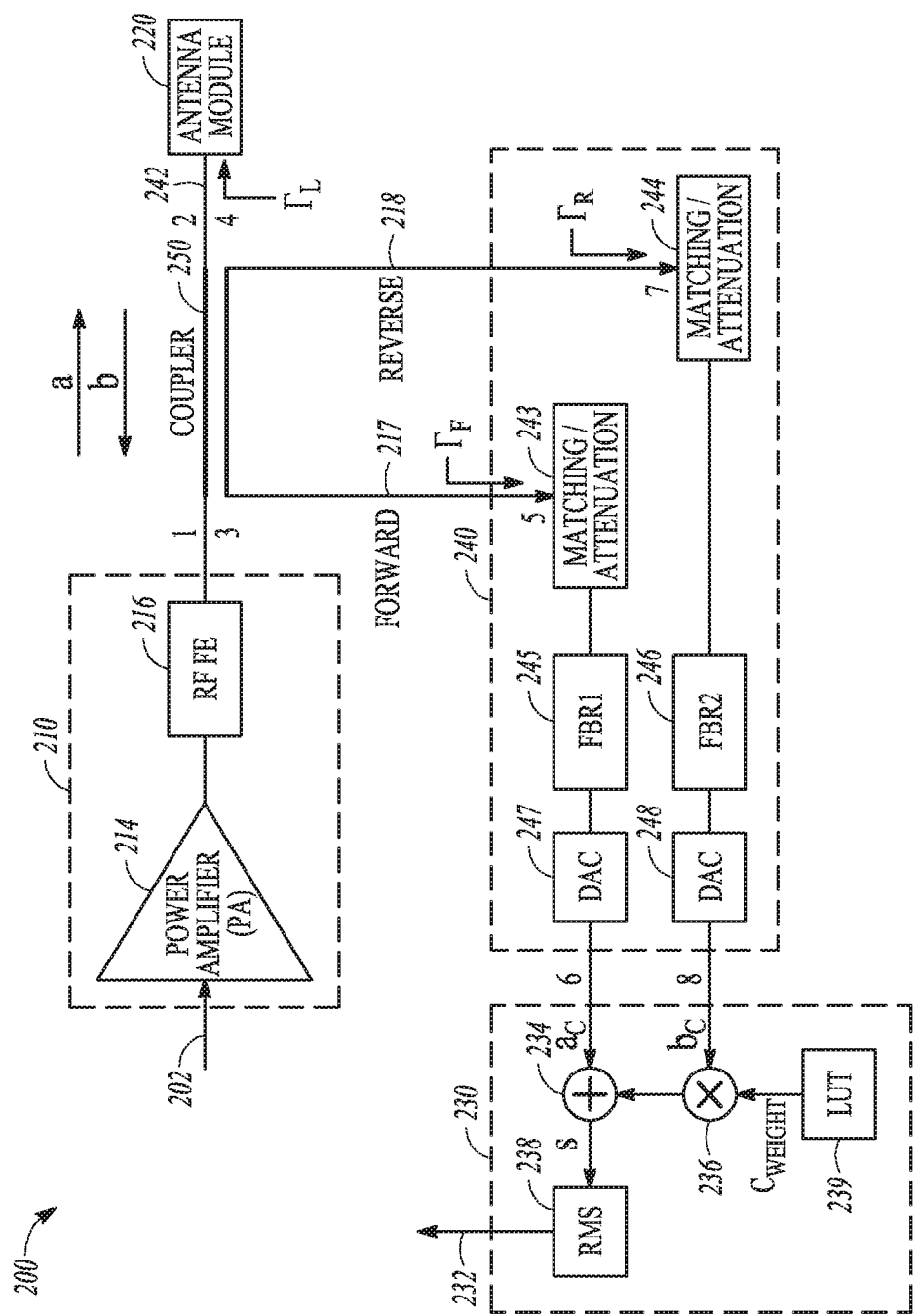
FIG. 2 shows a block diagram of a further apparatus for determining information on a power variation of a transmit signal.

FIG. 2 shows a block diagram of an apparatus 200 for determining information on a power variation of a transmit signal according to an example. The apparatus 200 comprises a power amplifier module 210, an antenna module 220, a power variation determining module 230, a feedback receiver module 240 and a directional coupler 250. The direction coupler 250 is arranged within the transmit path between the power amplifier module 210 and the antenna module 220 (e.g. comprising at least one antenna). The feedback receiver 240 is connected to the directional coupler 250. Further, the feedback receiver module 240 is connected to the power variation determining module 230. The power amplifier module 210 comprises a power amplifier 214 (PA) amplifying a radio frequency transmit signal 202 applied at an input port (RF input signal). Further, the power amplifier module 210 may comprise an optional radio frequency front end module 216 (RF FE) for further processing of the amplified radio frequency transmit signal 212 (e.g. filtering). The amplified radio frequency transmit signal 212 is at least partly provided to the antenna module 220 through the directional coupler 250.

The directional coupler 250 comprises an input port 1, a transmitted port 2, a coupled port 3 and an isolated port 4. The input port 1 receives the amplified radio frequency transmit signal 212 and the transmitted port 2 provides at least partly the amplified radio frequency transmit signal 212 to the antenna module 220. The coupled port 3 provides a forward-coupled signal 216 mainly caused by the amplified radio frequency transmit signal 212 (e.g. the largest portion of the forward-coupled signal is caused by the amplified radio frequency transmit signal). Further, the isolated port 4 provides a reverse-coupled signal 218 mainly caused by a reverse wave signal reflected due to a varying impedance mismatch at the antenna module 220 received by the transmitted port 2 (e.g. the largest signal portion of the reverse-coupled signal is caused by the reverse wave signal).

The feedback receiver module 240 generates the first feedback signal $a_c$ based on the forward-coupled signal 216 and generates the second feedback signal $b_c$ based on the reverse-coupled signal 218. For example, the feedback receiver module 240 generates the first feedback signal $a_c$ at least by down-conversion (e.g. by a polar demodulator or an in-phase/quadrature-phase demodulator) of the forward-coupled signal 216 from a radio frequency domain to a baseband domain of the apparatus 200 and generates the second feedback signal $b_c$ at least by down-conversion (e.g. by a polar demodulator or an in-phase/quadrature-phase demodulator) of the reverse-coupled signal 218 from the radio frequency domain to the baseband domain of the apparatus 200.

Due to the low frequencies in the baseband domain of the apparatus 200 (compared to frequencies in the radio frequency domain), information related to a power variation of the amplified radio frequency transmit signal 212 can be determined with low effort.

In the example shown in FIG. 2, the feedback receiver module 240 comprises a first matching and attenuation module 243, a first feedback receiver 245 (FBR1) and a first digital-to-analog converter 247 (DAC) for generating the first feedback signal $a_c$ based on the forward-coupled signal 216 and a second matching and attenuation module 344, a second feedback receiver 246 (FBR2) and a second digital-to-analog converter 248 (DAC) for generating the second feedback signal $b_c$ based on the reverse-coupled signal 218. The feedback receiver module 240 receives the forward coupled signal 216 at a first input port 5 and the reverse-coupled signal 218 at a second input port 7 and provides the first feedback signal $a_c$ at a first output port 6 and the second feedback signal $b_c$ at a second output port 8.

The first matching and attenuation module 243 performs a matching and/or attenuation of the forward-coupled signal 216 (e.g. filtering by a filter and/or amplifying by a low-noise amplifier) and the second matching and attenuation module 244 performs a matching and/or attenuation of the reverse-coupled signal 218. The first feedback receiver 245 performs at least a down-conversion of the output signal of the first matching and attenuation module 243 from a radio frequency domain of the apparatus 200 to a baseband domain and the second feedback receiver 246 performs at least a down conversion of the output signal of the second matching and attenuation module 244 from the radio frequency domain to the baseband domain of the apparatus 200. Further, the first digital-to-analog converter 247 converts the analog output signal of the first feedback receiver 245 to a digital signal representing the first feedback signal $a_c$ and the second digital-to-analog converter 248 converts the analog output signal of the second feedback receiver 246 to a digital signal representing the second feedback signal $b_c$. Due to the digital-to-analog conversion of the feedback signals, the power variation determining module 230 can be implemented in the digital domain of the apparatus 200.

In other words, optionally, additionally or alternatively to one or more aspects mentioned above, the power variation determining module 230 may determine at least the weighted sum by digital signal processing. In this way, the determination of the weighted sum can be implemented with low effort.

In the example of FIG. 2, the power variation determining module 230 comprises an adder 234, a multiplier 236, a memory module 239 and a mean value determining module 238. The memory module 239 comprises a stored lookup table (LUT) providing the weighting factor $c_{weight}$ as mentioned above. The multiplier 236 multiplies the second feedback signal $b_c$ with the weighting factor $c_{weight}$ and the combiner 234 calculates the weighted sum s by adding the first feedback signal $a_c$ with the second feedback signal $b_c$ weighted by the weighting factor $c_{weight}$ outputted by the multiplier 236. The mean value determining module 238 generates the power variation signal 232 based on the weighted sum s so that the power variation signal 232 indicates a mean value of the power variation of the amplified radio frequency transmit signal 212 over time, for example. This power variation may mainly depend on effects (e.g. temperature influence to gain or filter characteristic or frequency influences) different from the impedance at the antenna module, since this contribution can be kept very low or can be reduced due to the weighted sum.

For example, the mean value determining module 238 determines or calculates the root mean square of the weighted sum s and outputs the result by the power variation signal 232 or outputs a change of the root mean square of the weighted sum s over time by the power variation signal 232.

The power variation signal 232 may be used as feedback signal for power control, for example. The first feedback signal or resulting forward wave $a_c$ may be a superposition of different contributions. The main contribution is the desired portion of forward power (e.g. given by $\gamma_1$ $k_{13}$ a). However, there may be at least two unwanted contributions causing a total forward wave $a_c$, which depends on antenna load $\Gamma_L$. One contribution is given by the limited isolation of the coupler ($\sim\gamma_1$ $k_{23}$ b) and the other one is caused by reflection of the coupled reverse wave or reverse coupled signal 218 at the non-50Ω termination of the reverse port 7 ($\sim\gamma_1$ $k_{24}$ b $\Gamma_R$). The same or similar is valid for the second feedback signal or reverse wave be. Simplified calculation delivers, for example:

$$a_C=\gamma_1[k_{13}a+k_{23}b+k_{24}b\Gamma_R]=\gamma_1 a[k_{13}+k_{23}\Gamma_L+k_{24}\Gamma_L\Gamma_R]$$

$$b_C=\gamma_2 a[k_{24}\Gamma_L+k_{14}+k_{13}\Gamma_F]$$

wherein $a_c$ is the first feedback signal, $b_c$ is the second feedback signal, $\gamma_1$ is a complex transfer factor from port 5 to port 6, $\gamma_2$ is a complex transfer factor from port 7 to port 8, $k_{13}$ is a complex coupling factor between port 1 and port 3, $k_{23}$ is an isolation factor from port 2 to port 3, $k_{24}$ is a complex coupling factor between port 2 and port 4, $k_{14}$ is an isolation factor from port 1 to port 4, $\Gamma_R$ is a reflection coefficient due to mismatch at port 7, $\Gamma_F$ is a reflection coefficient due to mismatch at port 5, $\Gamma_L$ is a reflection coefficient due to a varying impedance mismatch at the antenna module ($\Gamma_L=b/a$), a is the amplified radio frequency transmit signal and b is a reflected signal caused by a varying impedance mismatch at the antenna module.

The forward wave (first feedback signal) and the reverse wave (second feedback signal) can be added. This may be done as vector sum and by weighting the reverse wave with a complex factor $c_{weight}$ prior to the adding procedure.

$$s=a_C+c_{weight}b_C=\gamma_1 a[k_{13}+k_{23}\Gamma_L+k_{24}\Gamma_R\Gamma_L]+c_{weight}\gamma_2 a[k_{24}\Gamma_L+k_{14}+k_{13}\Gamma_F] \Rightarrow s=\gamma_1 a k_{13}+c_{weight}\gamma_2 a(k_{14}+k_{13}\Gamma_F)+a\Gamma_L(\gamma_1 k_{23}+\gamma_1 k_{24}\Gamma_R+\gamma_2 k_{24}c_{weight})$$

wherein s is the weighted sum and $c_{weight}$ is the weighting factor.

The weighting factor $c_{weight}$ can be selected such the $\Gamma_L$ dependent term (dependency on the varying impedance at the antenna module) is zero.

$$a\Gamma_L(\gamma_1 k_{23}+\gamma_1 k_{24}\Gamma_R+\gamma_2 k_{24}c_{weight})=$$

$$0 \Rightarrow c_{weight}=\frac{\gamma_1 k_{23}+\gamma_1 k_{24}\Gamma_R}{\gamma_2 k_{24}} \Rightarrow s=\gamma_1 a k_{13}+const$$

The vectorial edition of forward wave and the complex scaled reverse wave results in a sum signal s (weighted sum) which may not depend on antenna load $\Gamma_L$. It may only depend on the forward wave a (the amplified radio frequency transmit signal). This may mean that there is no (or negligible) power variation into VSWR (voltage standing wave ratio), for example. The delivered power may be completely (or nearly completely) flat across load phase, for example.

Further, the RMS value (root mean square) of the sum signal s may be calculated which can be used as a feedback signal for power control purposes.

The complex weighting factor $c_{weight}$ can be determined by front end (FE) specific parameters (e.g. parameters of the hardware configuration or architecture) like coupling factor and isolation. Therefore, the weighting factor could be determined for a given front end configuration based on a couple of boards (e.g. inlet) or devices and then used over mass production for all devices (e.g. mobile terminals) with the same front end configuration. In this way, the weighting factor can be easily predefined for a large number of equal proposed apparatus.

Alternatively, the weighting factor could be determined during factory calibration (e.g. considering manufacturing variations). In this way, the weighting factor $c_{weight}$ would eliminate the term depending on the varying impedance at the antenna module more accurately so that the portion of the weighted sum depending on the varying impedance at the antenna module may be close to zero or even zero.

Optionally, to improve flatness across band, a frequency-dependent weighting factor $c_{weight}$ may be used. The weighting factors can be stored in a dedicated lookup table. The lookup table entry may then be selected depending on the operating frequency (e.g. center frequency).

The apparatus 200 may comprise one or more optional additional features corresponding to one or more aspects mentioned in connection with the proposed concept or one or more examples described above.

Figure 3:
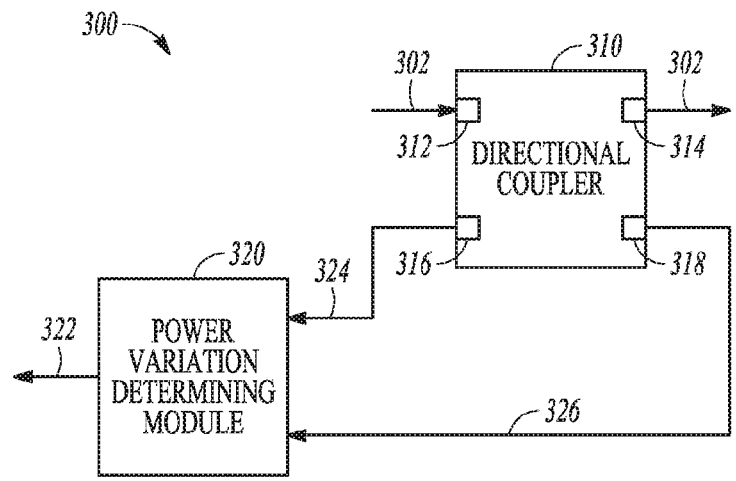
FIG. 3 shows a block diagram of a further apparatus for determining information on a power variation of a transmit signal.

FIG. 3 shows a block diagram of an apparatus 300 for determining information on a power variation of a transmit signal according to an example. The apparatus 300 comprises a directional coupler 310 and a power variation determining module 320. The directional coupler 310 comprises an input port 312, a transmitted port 314, a coupled port 316 and an isolated port 318. The input port 312 receives a radio frequency transmit signal 302 and the transmitted port 304 provides at least partly the radio frequency transmit signal 302 to an antenna module. The coupled port 316 provides a forward-coupled signal 324 mainly caused by the radio frequency transmit signal 302 provided to the input port 312 and the isolated port 318 provides a reverse-coupled signal 326 mainly caused by a reverse wave signal reflected due to a varying impedance mismatch at the antenna module received by the transmitted port 314. The power variation determining module 320 generates a power variation signal 322 comprising information related to a power variation of the radio frequency transmit signal 302 based on a weighted sum of a first feedback signal derived from the forward-coupled signal 324 and the second feedback signal derived from the reverse-coupled signal 326.

By calculating a weighted sum of two signals derived from a radio frequency transmit signal 302 but with different dependencies on an impedance at the antenna module, an influence of variations of the impedance at the antenna module or the weighted sum (e.g. which may vary due to varying environmental conditions) can be kept low or even completely removed. In this way, an information on the power variation of the amplified radio frequency transmit signal 302 can be determined without a contribution of the varying impedance at the antenna module or with negligible contribution of the varying impedance at the antenna module. In other words, due to the consideration of the weighted sum, information on a power variation for a nearly perfectly or a perfectly matched antenna module can be provided. Such information may be used for the control of the gain of a power amplifier module without or with negligible influence of the variation of the impedance at the antenna module. In this way, the power variation into mismatch may be significantly reduced, for example.

The explanations and descriptions provided in connection with the examples above (e.g. FIGS. 1 and 2) are also applicable to the apparatus 300. Especially, explanations related to the information on a power variation, the radio frequency transmit signal, the forward-coupled signal, the reverse-coupled signal, the varying impedance at the antenna module, the power variation determining module, the power variation signal, the determination of the weighted sum, the first feedback signal and the second feedback signal are correspondingly valid for the apparatus 300, for example.

Optionally, the apparatus 300 may comprise a power amplifier module for amplifying a radio frequency transmit signal to be amplified so that an amplified radio frequency transmit signal is provided to the input port 302 of the directional coupler 310.

Further, the apparatus 300 may comprise an antenna module transmitting the radio frequency transmit signal 302 provided by the transmitted port 314.

The apparatus 300 may comprise one or more further optional features corresponding to one or more aspects mentioned in connection with the proposed concept or one or more examples described above.

Some examples relate to an apparatus for determining information on a power variation of a transmit signal comprising means for amplifying signals, means for transmit signals and means for determining a power variation. The means for amplifying signals amplify a radio frequency transmit signal and the means for transmitting signals transmit at least partly the amplified radio frequency transmit signal. The means for determining a power variation determines a weighted sum of a first feedback signal derived from the amplified radio frequency transmit signal and a second feedback signal derived from the amplified radio frequency transmit signal. The first feedback signal and the second feedback signal comprise different dependencies on a varying impedance at the means for transmitting signals. Further, the means for determining a power variation generates a power variation signal based on the weighted sum. The power variation signal comprises information related to a power variation of the amplified radio frequency transmit signal.

The apparatus may comprise one or more additional optional features corresponding to one or more aspects mentioned in connection with the proposed concept or one or more examples described above.

Some examples relate to a transmitter or a transceiver comprising an apparatus for determining information on a power variation of a transmit signal according to the proposed concept or one or more examples described above.

Further examples relate to a mobile device (e.g. a cell phone, a tablet or a laptop) comprising a transmitter or a transceiver described above. The mobile device or mobile terminal may be used for communicating in a mobile communication system.

Figure 4:
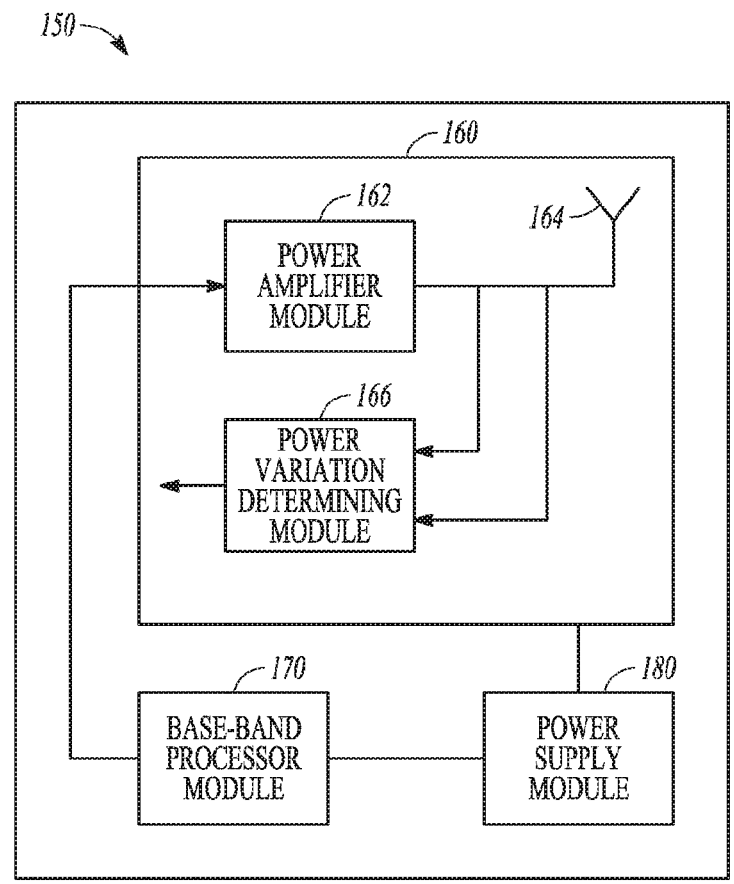
FIG. 4 shows a block diagram of a mobile device.

FIG. 4 shows a schematic illustration of a mobile device 150. The mobile device comprises an apparatus 160 for determining information on a power variation of a transmit signal comprising at least a power amplifier module 162, an antenna module 164 and power variation determining module 166 as described in connection with the proposed concept or one or more examples described above. Further, the mobile device comprises a baseband processor module 170 generating a baseband transmit signal being used to provide the radio frequency transmit signal to the power amplifier module 162. Additionally, the mobile device comprises a power supply unit 180 supplying at least the apparatus 160 and the baseband processor module 170 with power.

The mobile device 100 may provide information of a power variation of an amplified radio frequency transmit signal to be transmitted with low or even no dependency on a variation of an impedance at the antenna module 164 due to the implementation of a proposed apparatus 160. Further, the mobile device 100 may provide the amplified radio frequency transmit signal with low power variation caused by a varying impedance mismatch at the antenna module 164 by using the power variation signal for power control of the power amplifier module 162, for example.

In some examples, a cell phone may comprise a transmitter or a transceiver comprising an apparatus for determining information on a power variation of a transmit signal according to the proposed concept or one or more examples described above.

Further, some examples relate to a base station or a relay station of a mobile communication system comprising a transmitter or a transceiver with an apparatus for determining information on a power variation of a transmit signal according to the described concept or one or more examples described above.

A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WI-MAX) IEEE 802.16 or Wireless Local Area Network (WLAN) IEEE 802.11, generally any system based on Time Division Multiple Access (TDMA), Frequency Division Multiple Access (FDMA). Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

Some examples relate to a minimization of power variation into mismatch by means of forward and reverse wave. It is suggested to use a simultaneous evaluation of forward and reflect wave with respect to magnitude and phase in order to minimize the power variation into mismatch. For this, the vector sum of forward wave and complex-weighted reverse wave can be determined. The complex-weighting factor of the reflected wave can be selected so that the vector sum does not depend on the antenna load impedance, for example. This may be done in an effort to minimize the power variation into mismatch. In this way, an extremely low power variation (e.g. smaller than 0.5 dB) can be reached across frequency.

A system using a directional coupler only sensing a portion of the forward power and the subsequent power detection for a power control loop comprising a power flatness into VSVR limited by the effective directivity. The effective directivity may be given by the intrinsic directivity of the coupler, by return loss of forward and reverse port and by limited isolation on board (e.g. coupling between power amplifier output and radio frequency feedback line for reverse power). It may be difficult to achieve a ripple (e.g. into a free 3:1 load) which is less than 1 dB although the coupler is located before the antenna. By using the proposed concept, the power variation into mismatch may be improved beyond a limit given by the effective directivity of the system, for example.

For example, a proposed apparatus may offer an attractive implementation in all mobile terminals, although it may also be applied in other fields (e.g. base station of communication networks).

FIG. 4 shows a flowchart of a method 400 for determining information on a power variation of a transmit signal. The method 400 comprises amplifying 410 a radio frequency transmit signal and transmitting 420 the amplified radio frequency transmit signal at least partly by an antenna module. Further, the method 400 comprises determining 430 a weighted sum of a first feedback signal derived from the amplified radio frequency transmit signal and a second feedback signal derived from the amplified radio frequency transmit signal. The first feedback signal and the second feedback signal comprise different dependencies on a varying impedance at the antenna module. Further, the method 400 comprises generating 440 a power variation signal based on the weighted sum so that the power variation signal comprises information related to a power variation of the amplified radio frequency transmit signal.

The method 400 may comprise one or more additional optional acts corresponding to one or more aspects mentioned in connection with the proposed concept or one or more examples described above.

Figure 5A:
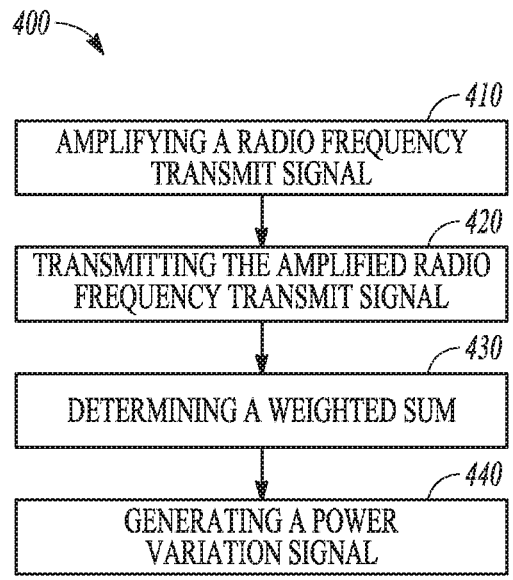
FIG. 5a shows a flowchart of a method for determining information on the power variation of a transmit signal.
Figure 5B:
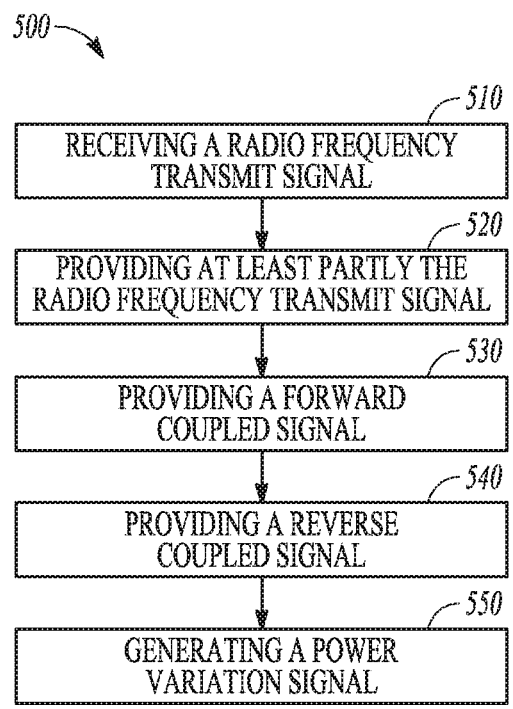
FIG. 5b shows a flowchart of a further method for determining information on a power variation of a transmit signal.

FIG. 5 shows a flowchart of a method 500 for determining information on a power variation of a transmit signal with a directional coupler. The directional coupler comprises an input port, a transmitted port, a coupled port and an isolated port. The method 500 comprises receiving 510 a radio frequency transmit signal at the input port and providing 520 at least partly the radio frequency transmit signal by the transmitted port to an antenna module. Further, the method 500 comprises providing 530 a forward-coupled signal mainly caused by the radio frequency transmit signal by the coupled port and providing 540 a reverse coupled signal by the isolated port mainly caused by a reverse wave signal reflected due to a varying impedance mismatch at the antenna module received by the transmitted port. Additionally, the method 500 comprises generating 550 a power variation signal comprising information related to a power variation of the radio frequency transmit signal based on a weighted sum of the first feedback signal derived from the forward-coupled signal and a second feedback signal derived from the reverse-coupled signal.

The method 500 may comprise one or more additional optional acts corresponding to one or more aspects mentioned in connection with the proposed concept or one or more examples described above.

In the following examples pertain to further examples. Example 1 is an apparatus for determining information on a power variation of a transmit signal. The apparatus comprises a power amplifier module configured to amplify a radio frequency transmit signal, an antenna module configured to transmit at least partly the amplified radio frequency transmit signal and a power variation determining module configured to determine a weighted sum of a first feedback signal derived from the amplified radio frequency transmit signal and a second feedback signal derived from the amplified radio frequency transmit signal, wherein the first feedback signal and the second feedback signal comprise different dependencies on a varying impedance at the antenna module, wherein the power variation determining module is further configured to generate a power variation signal based on the weighted sum, wherein the power variation signal comprises information related to a power variation of the amplified radio frequency transmit signal.

In example 2, the subject matter of example 1 can optionally include the power variation determining module configured to determine the weighted sum by adding the first feedback signal and the second feedback signal weighted by a weighting factor.

In example 3, the subject matter of example 2 can optionally include the weighting factor being a complex value.

In example 4, the subject matter of example 2 or 3 can optionally include the weighting factor being constant for a constant center frequency of the amplified radio frequency transmit signal.

In example 5, the subject matter of any one of examples 2-4 can optionally include the weighting factor varying for different center frequencies.

In example 6, the subject matter of any one of examples 2-5 can optionally include the weighting factor being selected or predefined so that a portion of the weighted sum depending on the varying impedance at the antenna module 120 represents less than 1% of the weighted sum or the weighted sum is independent of the varying impedance at the antenna module.

In example 7, the subject matter of any one of examples 2-6 can optionally include the weighting factor being selected or predefined so that a portion of the weighted sum depending on a reverse wave signal reflected due to a varying impedance mismatch at the antenna module is less than 1% of the weighted sum or the weighted sum is independent of the reverse wave signal reflected due to a varying impedance mismatch at the antenna module.

In example 8, the subject matter of any one of examples 2-7 can optionally include the power variation determining module comprising a memory module comprising a stored look-up-table configured to provide the weighting factor.

In example 9, the subject matter of any one of examples 1-8 can optionally include the first feedback signal and the second feedback signal comprising signal portions related to the amplified radio frequency transmit signal and a reverse wave signal caused by a reflection of the amplified radio frequency transmit signal due to a varying impedance mismatch at the antenna module.

In example 10, the subject matter of any one of examples 1-9 can optionally include the first feedback signal and the second feedback signal derived from the amplified radio frequency transmit signal at different positions within a transmit path between the power amplifier module and the antenna module.

In example 11, the subject matter of any one of examples 1-10 can optionally include a duplexer module and an antenna switch module within the transmit path between the power amplifier module and the antenna module, wherein the first feedback signal is derived from the amplified radio frequency transmit signal between the power amplifier module and the duplexer module and the second feedback signal is derived from the amplified radio frequency transmit signal between the duplexer module and antenna module, the first feedback signal is derived from the amplified radio frequency transmit signal between the duplexer module and the antenna switch module and the second feedback signal is derived from the amplified radio frequency transmit signal between the antenna switch module and the antenna module or the first feedback signal and the second feedback signal are derived from the amplified radio frequency transmit signal by a directional coupler located between the power amplifier module and the duplexer module, between the duplexer module and the antenna switch module or between the antenna switch module and antenna module.

In example 12, the subject matter of any one of examples 1-11 can optionally include a directional coupler comprising an input port, a transmitted port, a coupled port and an isolated port, wherein the input port is configured to receive the amplified radio frequency transmit signal, wherein the transmitted port is configured to provide at least partly the amplified radio frequency transmit signal to the antenna module, wherein the coupled port is configured to provide a forward coupled signal mainly caused by the amplified radio frequency transmit signal, wherein the isolated port is configured to provide a reverse coupled signal mainly caused by a reverse wave signal reflected due to a varying impedance mismatch at the antenna module received by the transmitted port, wherein the first feedback signal is based on the forward coupled signal and the second feedback signal is based on the reverse coupled signal.

In example 13, the subject matter of example 12 can optionally include a feedback receiver module configured to generate the first feedback signal at least by a down conversion of the forward coupled signal from a radio frequency domain to a baseband domain of the apparatus and configured to generate the second feedback signal at least by a down conversion of the reverse coupled signal from the radio frequency domain to the baseband domain of the apparatus.

In example 14, the subject matter of any one of examples 1-13 can optionally include the power variation determining module configured to determine the weighted sum by digital signal processing.

In example 15, the subject matter of any one of examples 1-14 can optionally include the power variation determining module configured to generate the power variation signal based on a root mean square calculation of the weighted sum over a predefined time interval.

In example 16, the subject matter of any one of examples 1-15 can optionally include the power variation determining module configured to control a gain of the power amplifier module based on the power variation signal.

In example 17, the subject matter of any one of examples 1-16 can optionally include the power variation signal generated in real time so that a gain control of the power amplifier module based on the power variation signal is enabled.

In example 18, the subject matter of any one of examples 1-17 can optionally include the radio frequency transmit signal containing information intended to be transmitted to a receiver.

Example 19 is an apparatus for determining information on a power variation of a transmit signal. The apparatus comprises a directional coupler comprising an input port, a transmitted port, a coupled port and an isolated port, wherein the input port is configured to receive a radio frequency transmit signal, wherein the transmitted port is configured to provide at least partly the radio frequency transmit signal to an antenna module, wherein the coupled port is configured to provide a forward coupled signal mainly caused by the radio frequency transmit signal, wherein the isolated port is configured to provide a reverse coupled signal mainly caused by a reverse wave signal reflected due to a varying impedance mismatch at the antenna module received by the transmitted port, and a power variation determining module configured to generate a power variation signal comprising information related to a power variation of the radio frequency transmit signal based on a weighted sum of a first feedback signal derived from the forward coupled signal and a second feedback signal derived from the reverse coupled signal.

In example 20, the subject matter of example 19 can optionally include a power amplifier module configured to provide the radio frequency transmit signal to the input port by amplifying a radio frequency transmit signal to be amplified.

In example 21, the subject matter of example 19 or 20 can optionally include an antenna module configured to transmit at least partly the radio frequency transmit signal provided by the transmitted port.

Example 19 is an apparatus for determining information on a power variation of a transmit signal. The apparatus comprises means for amplifying signals configured to amplify a radio frequency transmit signal, means for transmitting signals configured to transmit at least partly the amplified radio frequency transmit signal and means for determining a power variation configured to determine a weighted sum of a first feedback signal derived from the amplified radio frequency transmit signal and a second feedback signal derived from the amplified radio frequency transmit signal, wherein the first feedback signal and the second feedback signal comprise different dependencies on a varying impedance at the means for transmitting signals, wherein the means for determining a power variation is further configured to generate a power variation signal based on the weighted sum, wherein the power variation signal comprises information related to a power variation of the amplified radio frequency transmit signal.

Example 23 is a transmitter or a transceiver comprising an apparatus according to one of the examples 1 to 22.

Example 24 is a mobile device comprising a transmitter or a transceiver according to example 23.

Example 25 is a cell phone comprising a transmitter or a transceiver according to example 23.

Example 26 is a method for determining information on a power variation of a transmit signal. The method comprises amplifying a radio frequency transmit signal, transmitting the amplified radio frequency transmit signal at least partly by an antenna module, determining a weighted sum of a first feedback signal derived from the amplified radio frequency transmit signal and a second feedback signal derived from the amplified radio frequency transmit signal, wherein the first feedback signal and the second feedback signal comprise different dependencies on a varying impedance at the antenna module and generating a power variation signal based on the weighted sum, wherein the power variation signal comprises information related to a power variation of the amplified radio frequency transmit signal.

Example 27 is a method for determining information on a power variation of a transmit signal with a directional coupler comprising an input port, a transmitted port, a coupled port and an isolated port. The method comprises receiving a radio frequency transmit signal at the input port, providing at least partly the radio frequency transmit signal by the transmitted port to an antenna module, providing a forward coupled signal mainly caused by the radio frequency transmit signal by the coupled port, providing a reverse coupled signal by the isolated port mainly caused by a reverse wave signal reflected due to a varying impedance mismatch at the antenna module received by the transmitted port and generating a power variation signal comprising information related to a power variation of the radio frequency transmit signal based on a weighted sum of a first feedback signal derived from the forward coupled signal and a second feedback signal derived from the reverse coupled signal.

Example 28 is a machine readable storage medium including program code, when executed, to cause a machine to perform the method of any one of examples 26 or 27.

Example 29 is a machine readable storage including machine readable instructions, when executed, to implement a method or realize an apparatus as implemented by any one of examples 1-27.

Example 30 is a computer program having a program code for performing the method of examples 26 or 27, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . ." (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An apparatus comprising:
   power amplifier circuitry configured to amplify a radio frequency signal to generate a transmit signal;
   a directional coupler configured to:
   receive the transmit signal;
   output a portion of the transmit signal to antenna circuitry;
   receive a reverse signal from the antenna circuitry, the reverse signal comprising a reflection of the portion of the transmit signal due to an impedance mismatch between the directional coupler and the antenna circuitry;
   output a reflected signal from the reverse signal; and
   output a forward power signal; and
   power determining circuitry configured to generate the power feedback signal for the power amplifier from the forward power signal and the reflected signal, where the power feedback signal indicates a change of output power of the power amplifier; and
   a lookup table (LUT) coupled to the power determining circuitry, wherein the power feedback signal is further based on a LUT value in the LUT;
   wherein the power determining circuitry is further configured to generate a power variation signal, wherein the power variation signal is based on a first feedback signal generated from the forward power signal and a second feedback signal generated from the reflected signal; and wherein the power variation signal is further generated as a weighted sum of the first feedback signal and the second feedback signal using a weighting factor.

2. The apparatus of claim 1 further comprising:
the antenna circuitry coupled to the directional coupler and configured to receive the portion of the transmit signal, reflect the reverse wave signal, and transmit at least partly the portion of the transmit signal.

3. The apparatus of claim 2 wherein the antenna circuitry comprises an antenna configured to radiate the transmit portion of the transmit signal.

4. The apparatus of claim 1 wherein the directional coupler comprises an input port, a transmitted port, a coupled port, and an isolated port.

5. The apparatus of claim 4 wherein the transmit signal is received at the input port of the directional coupler;
wherein the reverse signal is received at the transmitted port of the directional coupler;
wherein the coupled port is configured to output the forward power signal; and
wherein the isolated port is configured to output the reflected signal.

6. The apparatus of claim 1 wherein a gain of the power amplifier is controlled based on the power feedback signal from the power determining circuitry.

7. The apparatus according to claim 1, wherein the weighting factor is constant for a constant center frequency of the transmit signal.

8. The apparatus according to claim 1, wherein the weighting factor is predefined to have a portion of the weighted sum depending on a varying impedance at the antenna circuitry.

9. The apparatus according to claim 8, wherein the weighting factor is determined from the lookup table (LUT) value stored in a memory of the power determining circuitry.

10. An apparatus comprising:
an input interface configured to receive a reflected signal and a forward power signal from a directional coupler, wherein the forward power signal is derived from a transmit signal as amplified from a radio frequency (RF) by a power amplifier, and wherein the reflected signal is derived from a portion of the transmit signal reflected by antenna circuitry due to an impedance mismatch between the directional coupler and an antenna;
power determining circuitry configured to process the reflected signal and the forward power signal from the communication interface to generate a power feedback signal for a power amplifier from the forward power signal and the reflected signal, where the power feedback signal indicates a change of an average output power of the power amplifier;
a lookup table (LUT) coupled to the power determining circuitry, wherein the power feedback signal is further based on a LUT value in the LUT; and
an output interface configured to output the power feedback signal to the power amplifier;
wherein the power determining circuitry is further configured to generate a power variation signal, wherein the power variation signal is based on a first feedback signal generated from the forward power signal and a second feedback signal generated from the reflected signal; and
wherein the power variation signal is further generated as a weighted sum of the first feedback signal and the second feedback signal using a weighting factor.

11. The apparatus of claim 10, wherein the apparatus further comprises the power amplifier; and
wherein the power amplifier is configured to amplify the RF signal to generate the transmit signal; and
wherein a gain of the power amplifier is controlled based on the power feedback signal from the power determining circuitry.

12. The apparatus of claim 10 further comprising the directional coupler;
wherein the directional coupler comprises an input port, a transmitted port, a coupled port, and an isolated port;
wherein the transmit signal is received at the input port of the directional coupler;
wherein the a reverse wave signal is received at the transmitted port of the directional coupler;
wherein the coupled port is configured to output the forward power signal; and
wherein the isolated port is configured to output the reflected signal.

13. The apparatus of claim 10 wherein the power determining circuitry is further configured to generate a power variation signal;
wherein the power variation signal is based on a first feedback signal generated from the forward power signal and a second feedback signal generated from the reflected signal, and wherein the power variation signal is further generated as a weighted sum of the first feedback signal and the second feedback signal.

14. The apparatus according to claim 13, wherein a weighting factor used to generate the weighted sum is constant for a constant center frequency of the transmit signal.

15. The apparatus of claim 1 further comprising:
the antenna circuitry coupled to the directional coupler and configured to receive the portion of the transmit signal, reflect the reverse wave signal, and transmit at least a transmit portion of the transmit signal from the portion of the transmit signal.

16. A non-transitory computer readable storage medium comprising instructions that, when executed by circuitry of a device, cause the device to perform operations for power control of a transmit signal using a power feedback signal, the circuitry to:
generate a radio frequency (RF) signal;
generate a power feedback signal from a reflected signal and a forward power signal output from a directional coupler, wherein the forward power signal is generated by the directional coupler from a transmit signal generated from the RF signal by a power amplifier, wherein the reflected signal is generated by the directional coupler from a portion of the transmit signal reflected by antenna circuitry due to an impedance mismatch between the directional coupler and an antenna, and wherein the power feedback signal is generated based on a lookup table (LUT) value from a LUT; and
adjust the power control of the power amplifier for the transmit signal using the power feedback signal;
wherein the power variation signal is based on a first feedback signal generated from the forward power signal and a second feedback signal generated from the reflected signal, and wherein the power variation signal is further generated as a weighted sum of the first feedback signal and the second feedback signal.

17. The non-transitory computer readable storage medium of claim 16, wherein a weighting factor for the weighted sum is predefined to have a portion of the weighted sum depending on a varying impedance at the antenna circuitry.

18. An apparatus comprising:
power amplifier circuitry configured to amplify a radio frequency signal to generate a transmit signal;
means for generating a reflected signal and a forward power signal from the transmit signal and a reverse signal, the reverse signal comprising a reflection of a portion of the transmit signal due to an impedance mismatch with antenna circuitry;
means for generating a lookup table (LUT) value from a LUT; and
means for generating a power variation signal and a power feedback signal for the power amplifier from the forward power signal and the reflected signal, where the power feedback signal indicates a change of output power of the power amplifier wherein the power variation signal is based on a first feedback signal generated from the forward power signal and a second feedback signal generated from the reflected signal, and wherein the power variation signal is further generated as a weighted sum of the first feedback signal and the second feedback signal using a weighting factor.

19. The apparatus of claim 1 further comprising:
the antenna circuitry configured to receive the portion of the transmit signal, reflect the reverse wave signal, and transmit at least partly the portion of the transmit signal.

20. The apparatus of claim 3 wherein the antenna circuitry comprises an antenna configured to radiate the transmit portion of the transmit signal.

21. The apparatus of claim 1 wherein a gain of the power amplifier is controlled based on the power feedback signal.

22. The apparatus according to claim 16, wherein the weighting factor is constant for a constant center frequency of the transmit signal.

23. The apparatus according to claim 16, wherein the weighting factor is predefined to have a portion of the weighted sum depending on a varying impedance at the antenna circuitry.

24. The apparatus according to claim 23, wherein the weighting factor is determined from the lookup table (LUT) value stored in a memory of the power determining circuitry.

* * * * *